US 6,539,066 B1

(12) United States Patent
Heinen

(10) Patent No.: US 6,539,066 B1
(45) Date of Patent: Mar. 25, 2003

(54) INTEGRABLE RADIO RECEIVER CIRCUIT FOR FREQUENCY-MODULATED DIGITAL SIGNALS

(75) Inventor: Stefan Heinen, Krefeld (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/437,957

(22) Filed: Nov. 10, 1999

Related U.S. Application Data

(63) Continuation of application No. PCT/DE99/00267, filed on Feb. 1, 1999.

(30) Foreign Application Priority Data

Mar. 11, 1998 (DE) .......................................... 198 10 558

(51) Int. Cl.[7] ............................ H03D 3/00; H04L 27/14
(52) U.S. Cl. ........................ 375/334; 375/316; 375/322
(58) Field of Search ................................. 375/334, 316, 375/317, 322, 340; 329/315, 318, 320, 321; 455/205, 189.1, 190.1, 311, 312, 313, 302

(56) References Cited

U.S. PATENT DOCUMENTS

| 3,736,511 A | * | 5/1973 | Gibson ........................ 325/321 |
| 5,031,193 A | * | 7/1991 | Atkinson et al. ............. 375/13 |
| 5,230,011 A | * | 7/1993 | Gielis et al. .................. 375/97 |
| 5,341,107 A | * | 8/1994 | Bijker et al. ................. 329/337 |
| 5,479,453 A | * | 12/1995 | Anvari et al. ................ 375/348 |
| 5,572,164 A | * | 11/1996 | Kasperkovitz et al. ....... 329/315 |
| 5,715,529 A | * | 2/1998 | Kianush et al. .............. 455/266 |
| 5,901,180 A | * | 5/1999 | Aslanis et al. ............... 375/261 |
| 6,035,186 A | * | 3/2000 | Moore et al. ................ 455/313 |

FOREIGN PATENT DOCUMENTS

| DE | 19612714 A1 | 10/1997 |
| EP | 0153020 | 8/1985 |
| GB | 1530602 | 11/1978 |
| WO | WO 93/14578 | 7/1993 |

OTHER PUBLICATIONS

"A Single–Chip VHF and UHF Receiver For Radio Paging" (Wilson et al.), in IEEE Journal of Solid–State Circuits, vol. 26, No. 12, dated Dec. 12, 1991.
"CMOS Wireless Transceiver Design" (Crols et al.), Kluwer Academic Publishers, dated 1997, pp. 52–68.

* cited by examiner

Primary Examiner—Mohammad H. Ghayour
(74) Attorney, Agent, or Firm—Laurence A. Greenberg; Werner H. Stemer; Ralph E. Locher

(57) ABSTRACT

An FM receiver, which contains quadrature downward mixing to a low IF, analog IF polyphase filters in quadrature signal paths and an analog quadrature signal demodulator, has AC coupling in its two quadrature signal paths. At its output, the demodulator produces a voltage that is proportional to the input frequency and is supplied to the input of a decision circuit that determines the digital signal state. The circuit according to the invention can be used in DECT receivers.

11 Claims, 2 Drawing Sheets

INTEGRABLE RADIO RECEIVER CIRCUIT FOR FREQUENCY-MODULATED DIGITAL SIGNALS

CROSS-REFERENCE TO RELATED APPLICATION

This is a continuation of copending International Application PCT/DE99/00267, filed Feb. 1, 1999, which designated the United States.

BACKGROUND OF THE INVENTION

Field of the Invention

The invention relates to an integrable radio receiver circuit which quadrature downward mixes a received RF signal to a low intermediate frequency (IF). The low IF signal is then IF channel filtered in an analog polypahse filter before being forwarded to an quadrature signal demodulator.

Analog homodyne receivers are used on radio paging receivers, that is to say for so-called pagers, for the radio paging service. The frequency modulation (FM) which is used for this service makes it possible to use AC coupling to suppress static and dynamic offset voltages in such a receiver.

A known circuit, which is integrated in a single chip, for a homodyne receiver used in a pager is described, for example, by J. Wilson, R. Youell, T. Richards, G. Luff, R. Pilaski in the article "A Single Chip VHF and UHF Receiver for Radio aging" in IEEE Journal of Solid State Circuits, Vol. 26, No. Dec. 2, 1991.

In this case, the RF received signal coming from an antenna is supplied, after amplification in an RF amplifier and after being split into two signals with a phase offset of 90° by a phase element, to two first inputs of a quadrature downward mixer. An output signal of an RF oscillator, which is multiplied in a frequency multiplier, is applied to two second inputs of the quadrature downward mixer.

Channel filtering is carried out following amplification in amplifiers by integrated low-pass filters, which are AC-coupled to one another by a capacitor respectively, in a I path, and integrated low-pass filters in a Q path. The signals in the I and Q paths are supplied separately via in each case one limiting amplifier, respectively, to an analog demodulator ("quadricorrelator"), at whose output the demodulated output signal can then be picked off for display.

For radio systems which operate using Gaussian frequency shift keying (GFSK) or Gaussian minimum shift keying (GMSK) modulation, AC coupling is impossible, since most of the energy of the correspondingly modulated signal is concentrated at low frequencies.

A receiver which operates at a low intermediate frequency (low IF) and using digital demodulation is known from a book by J. Crols and M. Steyaert, titled "CMOS Wireless Transceiver Design", 1997, Kluwer Academic Publishers, pages 52 to 67 as well as pages 114 and 115 in this context for the GSM mobile radio system, which uses GMSK modulation.

Digital demodulation requires a linear signal path as far as the analog/digital converters which, when used in conjunction with a digital European cordless communications (DECT) system should have a resolution of 12–13 bits with a bandwidth of about 800 kHz (bandpass converter). However, with the technologies available at the moment, this can be achieved only with considerable complexity, and at a high cost.

SUMMARY OF THE INVENTION

It is accordingly an object of the invention to provide an integrable radio receiver circuit for frequency-modulated digital signals which overcomes the above-mentioned disadvantages of the prior art devices of this general type.

The invention is based on the object of specifying a receiver circuit for receiving frequency-modulated digital radio signals, that is to say, in particular, FSK, MSK, GFSK and GMSK-modulated signals, in which, on the one hand, static and dynamic offset voltages are reliably suppressed and in which, on the other hand, there is no need for a linear signal path as far as the analog/digital converters, so that the technical complexity can be considerably reduced. In this case, the aim is for it to be possible to produce the receiver using large-scale integration and without using any external IF filters.

With the foregoing and other objects in view there is provided, in accordance with the invention, an integrable radio receiver circuit, including:

an antenna for receiving an RF signal being a frequency-modulated digital signal;

a first quadrature signal path, containing:
  a first downward mixer receiving and downward mixing the RF signal to a first low intermediate frequency (IF) signal;
  an analog polyphase filter disposed downstream of the first downward mixer for channel filtering the first low intermediate frequency signal; and
  a first AC coupling;

a second quadrature signal path, containing:
  a second downward mixer receiving and downward mixing the RF signal to a second low intermediate frequency (IF) signal;
  the analog polyphase filter disposed downstream of the second downward mixer for channel filtering the second low intermediate frequency signal; and
  a second AC coupling;

an analog quadrature signal demodulator connected to the first quadrature signal path and the second quadrature signal path, the analog quadrature signal demodulator having an output producing an output signal with a voltage proportional to an input frequency; and a decision circuit having an adjustable decision threshold receives the output signal and determines digital signal states of the output signal.

The use of a low IF concept allows AC couplings to be used. There is no longer any need for the signal path linearity requirements that involve a high level of technical complexity. It is then possible to use analog filters and an analog demodulator which can be integrated on a substrate or chip.

The downstream decision circuit can also be integrated, so that the radio receiver circuit according to the invention can be produced, overall, using large-scale integration. The radio receiver circuit according to the invention thus results in a combination of the advantageous characteristics of the two proven types of reception circuit.

Other features which are considered as characteristic for the invention are set forth in the appended claims.

Although the invention is illustrated and described herein as embodied in an integrable radio receiver circuit for frequency-modulated digital signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
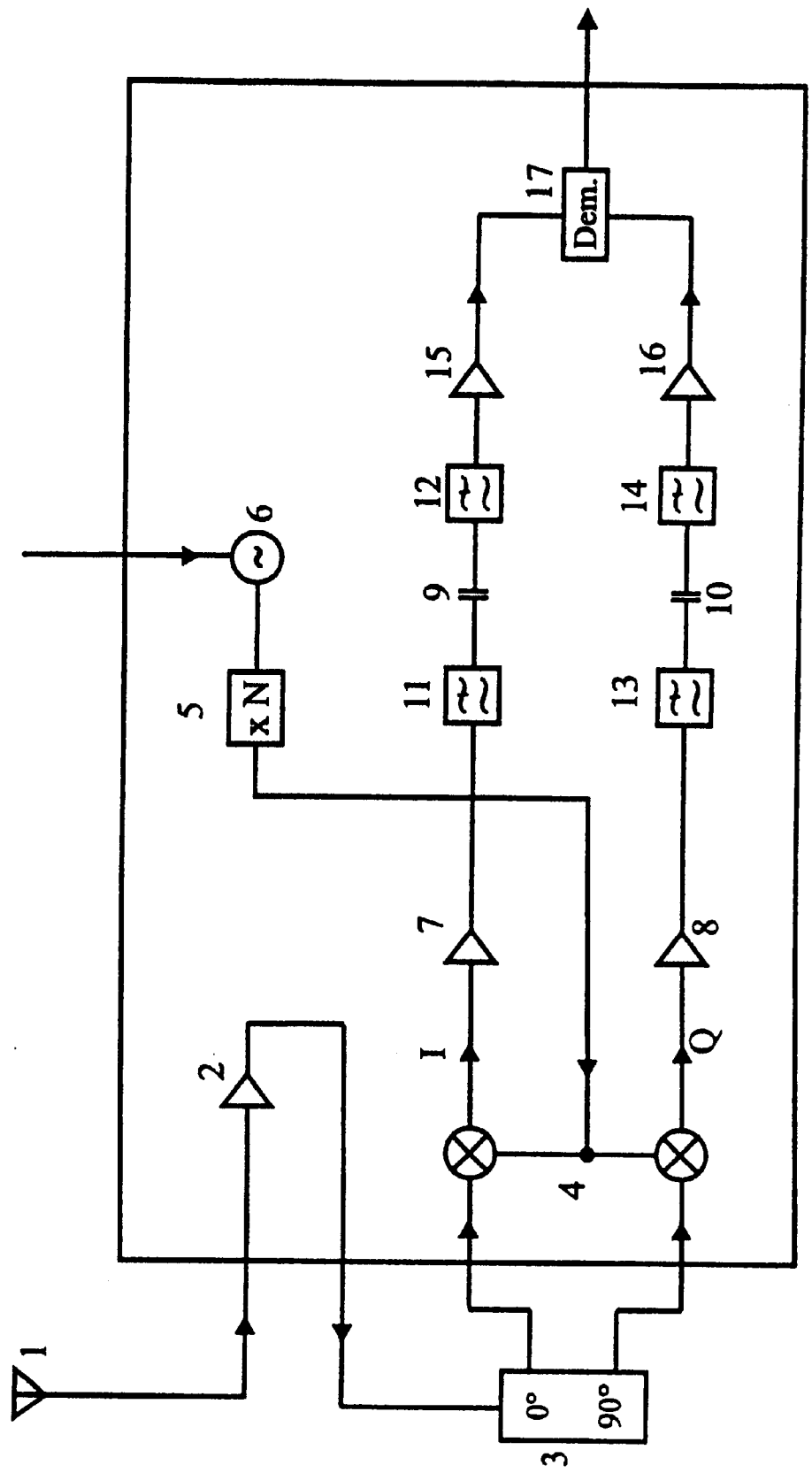
FIG. 1 is a diagrammatic, block circuit diagram of a prior art circuit of a pager.

In all the figures of the drawing, sub-features and integral parts that correspond to one another bear the same reference symbol in each case. Referring now to the figures of the drawing in detail and first, particularly, to FIG. 1 thereof, there is shown an RF received signal coming from an antenna 1 that is supplied, after amplification in an RF amplifier 2 and after being split into two signals with a phase offset of 90° by a phase element 3, to two first inputs of a quadrature downward mixer 4. Two second inputs of the quadrature downward mixer 4 receive an output signal of an RF oscillator 6, which is multiplied in a frequency multiplier 5.

Channel filtering is carried out following amplification in amplifiers 7 and 8 by integrated low-pass filters 11, 12, which are AC-coupled to one another by a capacitor 9 or 10 respectively, in the I path, and integrated low-pass filters 13, 14 in the Q path. The signals in the I and Q paths are supplied separately via in each case one limiting amplifier 15 or 16, respectively, to an analog demodulator 17 ("quadricorrelator"), at whose output the demodulated output signal can then be picked off for display.

For radio systems which operate using Gaussian frequency shift keying (GFSK) or Gaussian minimum shift keying (GMSK) modulation, AC coupling is impossible, since most of the energy of the correspondingly modulated signal is concentrated at low frequencies.

Figure 2:
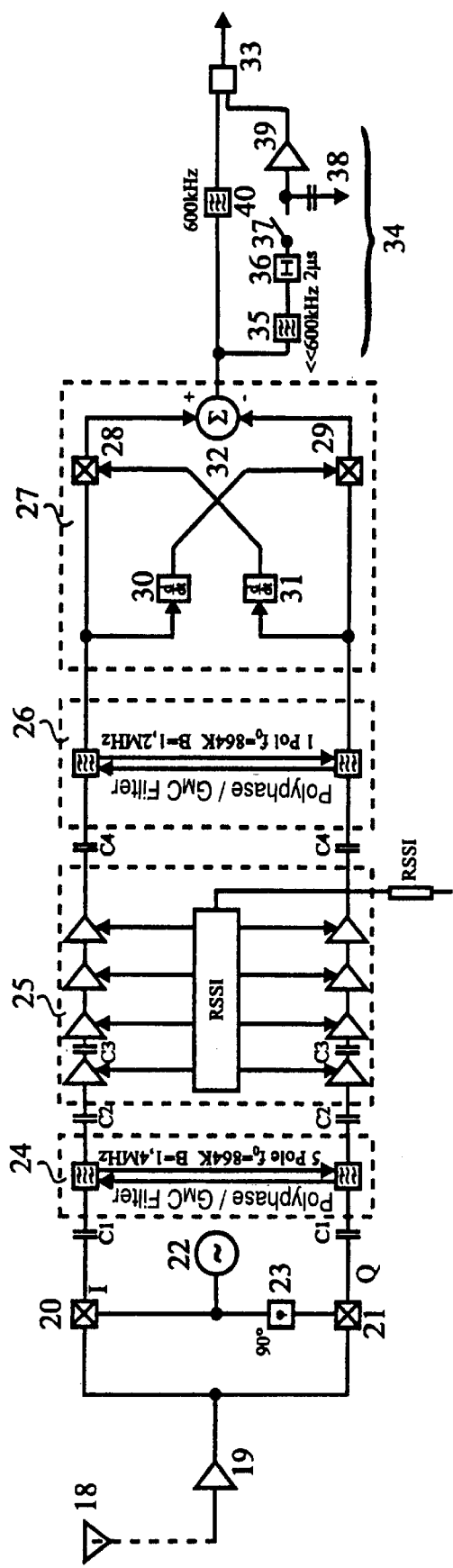
FIG. 2 is a block circuit diagram of an exemplary embodiment of a radio receiver circuit, which may be based on large-scale integration, according to the invention.

In the radio receiver circuit illustrated in FIG. 2, which can be used, for example, in a DECT system operating using GMSK modulation, the digitally frequency-modulated UHF received signal coming from an antenna 18 is supplied, after being amplified in a UHF amplifier 19, to each of first inputs of two downward mixers 20 and 21. As a heterodyning signal, an output signal of a UHF oscillator 22, which is normally in the form of a frequency synthesizer, is supplied directly to the downward mixer 20, and is supplied via a 90° phase element 23 to the downward mixer 21.

The downward mixers 20 and 21, the UHF oscillator 22 and the 90° phase element 23 thus lead to so-called quadrature downward mixing, in which the mixed output signal is passed on into two quadrature signal paths I and Q. The downward mixing takes place to a low IF. Self-calibrating analog polyphase filters 24, or else $G_MC$ filters, are provided for channel filtering ($G_M$=transconductance and C=capacitor).

After this, the signals in the I and Q paths are amplified in a limiting amplifier, a so-called limiter 25. This is possible since a carrier frequency is still present at the low IF. When used in a DECT system, the frequencies between 864 kHz and 1728 kHz may be present. After a further polyphase filter 26 or a further $G_MC$ filter for suppressing the harmonics produced in the limiter 25, the signals in the I and Q quadrature signal paths are supplied to an analog quadrature signal demodulator, that is to say to a so-called quadricorrelator 27 in the exemplary embodiment.

In the exemplary embodiment illustrated in FIG. 2, capacitive couplings in the form of series-connected capacitances C1, C2, C3 and C4 are provided for AC coupling at a plurality of circuit points in the two quadrature signal paths I and Q, and are each configured to be of equal size, in pairs. These capacitances reliably suppress static and dynamic offset voltages.

The quadricorrelator 27, which is composed of two mixers 28, 29, two differentiating elements 30, 31 and an adding element 32, produces at the output a differential voltage which is proportional to its input frequency. Since the intermediate frequency is, for example, 864 kHz, the modulation and permissible frequency offsets result in that the maximum input frequency is about 1.6 MHz. The quadricorrelator 27 therefore has to have a bandwidth of +/−1.6 MHz.

The absolute value of the output voltage of the quadricorrelator 27 for the nominal intermediate frequency depends on fluctuations in the technological parameters. The output voltage of the quadricorrelator 27 is used as an evaluation basis for the decisions made by a decision circuit 33 relating to the respective binary state of the received signal.

The definition of the decision threshold for the decision circuit 33 also has to take account of any possible frequency offset. The digital data is then present after the decision circuit 33.

In a DECT system, a binary "1010" sequence with a length of 16 bits, followed by a double binary "1", is transmitted at the start of a burst. As the exemplary embodiment illustrated in FIG. 2 shows, this particular sequence can be used to generate the decision threshold with the aid of a sample and hold circuit 34. To do this, the signal which has been demodulated in the quadricorrelator 27 is low-pass filtered in a low-pass filter 35, and is then delayed by a delay element 36.

The cut-off frequency of the low-pass filter 35 is considerably below the modulation frequency. This then results in the mean value of the signal during the described characteristic "1010" binary sequence. The mean value is then stored in a parallel-path capacitor 38, which can be charged via a sampling switch 37, and is supplied via a high-impedance buffer amplifier stage 39 to a control input of the decision circuit 33, in order to set the decision threshold.

The signal which has been demodulated by the quadricorrelator 27 is supplied to the decision circuit 33 via a parallel path which contains a low-pass filter 40. The cut-off frequency of the low-pass filter 40 in this path is above the maximum modulation frequency. The decision threshold is thus set during the sampling process.

When the double binary "1" of a DECT burst is identified in the digital part, the sampling switch 37 is opened, and this switch is always closed when the start of the characteristic "1010" binary sequence of a burst is identified. However, owing to the delay element 36, the double "1" still has no effect on the voltage of the parallel-path capacitor 38.

I claim:

1. An integrable radio receiver circuit, comprising:
   an antenna for receiving an RF signal being a frequency-modulated digital signal;
   a first quadrature signal path, containing:

a first downward mixer receiving and downward mixing the RF signal to a first low intermediate frequency (IF) signal;
an analog polyphase filter having an output side, said analog polyphase filter disposed downstream of said first downward mixer for channel filtering the first low intermediate frequency signal;
a first AC coupling; and
a limiting amplifier having an output side, said output side of said limiting amplifier connected to said analog polyphase filter, said first AC coupling disposed between said output side of said analog polyphase filter and said output side of said limiting amplifier;
a second quadrature signal path, containing:
a second downward mixer receiving and downward mixing the RF signal to a second low intermediate frequency (IF) signal;
said analog polyphase filter disposed downstream of said second downward mixer for channel filtering the second low intermediate frequency signal;
a second AC coupling; and.
a limiting amplifier having an output side, said output side of said limiting amplifier connected to said analog polyphase filter, said second AC coupling disposed between said output side of said analog polyphase filter and said output side of said limiting amplifier;
a quadrature signal demodulator connected to said first quadrature signal path and said second quadrature signal path, said quadrature signal demodulator having an output producing an output signal with a voltage proportional to an input frequency; and
a decision circuit having an adjustable decision threshold receives the output signal and determines digital signal states of the output signal.

2. The radio receiver circuit according to claim 1, wherein said quadrature signal demodulator is a quadricorrelator.

3. The radio receiver circuit according to claim 1, wherein said limiting amplifiers are disposed downstream of said analog polyphase filter and are provided for amplification of the first low intermediate frequency signal and a second low intermediate frequency signal; and
including a further filter disposed downstream of said limitin amplifier, said further filter suppressing harmonics produced in said limiting amplifier.

4. The radio receiver circuit according to claim 1, wherein for determining if the output signal is a binary "1" or "0", the adjustable decision threshold of said decision circuit is set.

5. The radio receiver circuit according to claim 1, wherein said first AC coupling and said second AC coupling are each formed of at least one capacitive coupling in a form of a capacitance.

6. The radio receiver circuit according to claim 5, wherein said at least one capacitive coupling is a plurality of capacitive couplings in a form of capacitances having equal sizes, in pairs.

7. An assembly, comprising:
a digital European cordless telecommunications (DECT) system; and
a radio receiver circuit including:
an antenna for receiving an RF signal being a frequency-modulated digital signal;
a first quadrature signal path, containing:
a first downward mixer receiving and downward mixing the RF signal to a first low intermediate frequency (IF) signal;
an analog polyphase filter disposed downstream of said first downward mixer for channel filtering the first low intermediate frequency signal;
a first AC coupling; and
a limiting amplifier;
a second quadrature signal path, containing:
a second downward mixer receiving and downward mixing the RF signal to a second low intermediate frequency signal;
said analog polyphase filter disposed downstream of said second downward mixer for channel filtering the second low intermediate frequency (IF) signal;
a second AC coupling; and
a limiting amplifier;
a quadrature signal demodulator connected to said first quadrature signal path and said second quadrature signal path, said quadrature signal demodulator having an output producing an output signal with a voltage proportional to an input frequency; and
a decision circuit having an adjustable decision threshold receives the output signal and determines digital signal states of the output signal.

8. The radio receiver circuit according to claim 7,
wherein said decision circuit has a control input for setting the adjustable decision threshold and a signal input;
including a sample and hold circuit disposed between said quadrature signal demodulator and said control input of said decision circuit, said sample and hold circuit receivers a characteristic binary "1010" sequence of a length of 16 bits followed by a double binary "1" at the start of a burst specified for the DECT system for determining the adjustable decision threshold, said sample and hold circuit, containing:
a low-pass filter connected to said output of said quadrature signal demodulator and having a cut-off frequency considerably below a modulation frequency;
a delay element disposed downstream of said low-pass filter;
a sampling switch disposed downstream of said delay element and being closed if the characteristic "1010" binary sequence is identified in a digital part and being opened if the double binary "1" is identified in the burst;
a parrallel-path capacitor for storing a signal mean value disposed downstream of said sampling switch;
a high-impedance buffer amplifier stage disposed downstream of said parallel-path capacitor and having an output connected to said control input of said decision circuit for setting the adjustable decision threshold; and
A low-pass filter disposed in a path parallel to a path formed a said low-pass filter, said delay element, said sampling switch, said parallel-path capacitor, and said high-impedance buffer amplifier stage, said low-pass filter connected to said output of said quadrature signal demodulator and to said signal input of said decision circuit, said low-pass filter having a cut-off frequency above a maximum modulation frequency.

9. The radio receiver circuit according to claim 3, wherein said further filter is a further analog polyphase filter.

10. The radio receiver circuit according to claim 1, wherein:
said limiting amplifier is a multi-stage limiting amplifier;
a third AC coupling is disposed in said first quadrature signal path between said output side of said analog polyphase filter and said-output side of said limiting amplifier, at least one amplifier stage of said multistage limiting amplifier is switched between said first AC coupling and said third AC coupling;

a fourth AC coupling is disposed in said second quadrature signal path between said output side of said analog polyphase filter and said output side of said limiting amplifier, at least one amplifier stage of said multistage limiting amplifier is switched between said second AC coupling and said fourth AC coupling.

11. An integrable radio receiver circuit, comprising:

an antenna for receiving an RF signal being a frequency-modulated digital signal;

a first quadrature signal path, containing;
- a first downward mixer receiving and downward mixing the RF signal to a first low intermediate frequency (IF) signal;
- an analog polyphase filter having an output side, said analog polyphase filter disposed downstream of said first downward mixer for channel filtering the first low intermediate frequency signal;
- a first AC coupling; and
- a limiting amplifier having an output side and an input side, said output side of said limiting amplifier connected to said analog polyphase filter, said first AC coupling disposed between said output side of said analog polyphase filter and said input side of said limiting amplifier;

a second quadrature signal path, containing:
- a second downward mixer receiving and downward mixing the RF signal to a second low intermediate frequency (IF) signal;
- said analog polyphase filter disposed downstream of said second downward mixer for channel filtering the second low intermediate frequency signal;
- a second AC coupling; and
- a limiting amplifier having an output side and input side, said output side of said limiting amplifier connected to said analog polyphase filter, said second AC coupling disposed between said output aide of said analog polyphase filter and said input side of said limiting amplifier;

a quadrature signal demodulator connected to said first quadrature signal path and said second quadrature signal path, said quadrature signal demodulator having an output producing an output signal with a voltage proportional to an input frequency; and a decision circuit having an adjustable decision threshold receives the output signal and determines digital signal states of the output signal.

\* \* \* \* \*

UNITED STATES PATENT AND TRADEMARK OFFICE
CERTIFICATE OF CORRECTION

PATENT NO. : 6,539,066 B1
DATED : March 25, 2003
INVENTOR(S) : Stefan Heinen

It is certified that error appears in the above-identified patent and that said Letters Patent is hereby corrected as shown below:

<u>Column 5,</u>
Line 45, should read as follows:
-- limiting amplifier, said further filter suppressing har- --

<u>Column 6,</u>
Line 46, should read as follows:
-- a parallel-path capacitor for storing a signal mean --
Line 54, should read as follows:
-- formed of said low-pass filter, said delay element, said --

<u>Column 8,</u>
Line 14, should read as follwos:
-- ond AC coupling disposed between said output side --

Signed and Sealed this

Nineteenth Day of August, 2003

JAMES E. ROGAN
*Director of the United States Patent and Trademark Office*